(12) United States Patent
Hirota et al.

(10) Patent No.: US 6,475,277 B1
(45) Date of Patent: Nov. 5, 2002

(54) GROUP III-V NITRIDE SEMICONDUCTOR GROWTH METHOD AND VAPOR PHASE GROWTH APPARATUS

(75) Inventors: Ryu Hirota, Osaka (JP); Masami Tatsumi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/605,845

(22) Filed: Jun. 29, 2000

(30) Foreign Application Priority Data

Jun. 30, 1999 (JP) .......................................... 11-186012

(51) Int. Cl.[7] .............................................. C30B 25/10
(52) U.S. Cl. ....................... 117/106; 117/108; 117/200; 118/723 VE
(58) Field of Search ................ 117/106, 108, 117/200; 118/723 VE (56) References Cited

U.S. PATENT DOCUMENTS

| | | | | |
|---|---|---|---|---|
| 5,847,397 A | * | 12/1998 | Moustakas | 250/370.06 |
| 6,001,173 A | * | 12/1999 | Bestwick et al. | 117/89 |
| 6,146,458 A | * | 11/2000 | Hooper et al. | 117/106 |
| 6,255,004 B1 | * | 7/2001 | Yoshida | 428/627 |
| 2001/0015437 A1 | * | 8/2001 | Ishii et al. | 257/12 |

FOREIGN PATENT DOCUMENTS

| | | | |
|---|---|---|---|
| JP | 61-179527 | | 8/1986 |
| JP | 07/221018 | * | 8/1995 |
| JP | 10-215000 | | 8/1998 |

OTHER PUBLICATIONS

K. Balakrishnan, et al, "Study on the initial stages of heteroepitaxial growth of hexagonal GaN on sapphire by plasma assisted MBE," Journal of Crystal Growth 189/190, 1998, pp. 244–249.

* cited by examiner

*Primary Examiner*—Robert Kunemund
(74) *Attorney, Agent, or Firm*—Smith, Gambrell & Russell, LLP (57) ABSTRACT

A vapor phase growth apparatus 1 for growing a group III-V nitride semiconductor (GaN) comprises a reaction ampoule 3 having a container 11 disposed therein for containing a group III element and an inlet 7 for introducing nitrogen; excitation means 15 for plasma-exciting nitrogen introduced from the inlet 7; and heating means 13 for heating a seed crystal 10 disposed within the reaction ampoule 3 and the container 11; wherein, upon growing the group III-V nitride semiconductor on the seed crystal 10, nitrogen is introduced from the inlet 7, and no gas is let out from within the reaction ampoule 3.

13 Claims, 9 Drawing Sheets

GROUP III-V NITRIDE SEMICONDUCTOR GROWTH METHOD AND VAPOR PHASE GROWTH APPARATUS

BACKGROUND OF THE INVENTION

1. Field of the Invention

The present invention relates to a growth method and vapor phase growth apparatus for group III-V nitride semiconductors such as gallium nitride (GaN).

2. Related Background Art conventionally known as a method of growing group III-V nitride semiconductors such as GaN are, for example, a hydride vapor phase epitaxy method (HVPE method) published in Japanese Patent Application Laid-Open No. HEI 10-215000 and an organic metal vapor phase epitaxy method (OMVFE method) published in Japanese Patent Application Laid-Open No. SHO 61-179527.

For growing gallium nitride (GaN) by the hydride vapor phase epitaxy method, (1) ammonia ($NH_3$) as a material gas for nitrogen (N), (2) hydrogen chloride (HCl) for generating gallium chloride (GaCl) as a material gas for gallium (Ga) and (3) hydrogen ($H_2$) as a carrier gas are continuously introduced into a reaction ampoule in which a boat containing Ga is disposed. AS GaCl, which is generated by a reaction between HCl and Ga, reacts with $NH_3$, gallium nitride (GaN) grows on a seed crystal, According to this method, a large amount of material gases can be continuously supplied into the reaction ampoule, whereby the reaction rate can be improved as compared with the case using a so-called closed ampoule method in which no material gases are supplied from the outside.

For growing gallium nitride (GaN) by the organic metal vapor phase epitaxy method, (1) an organic metal such as trimethyl gallium (TMG) and (2) ammonia ($NH_3$) are introduced as material gases into a reaction ampoule, whereas hydrogen or nitrogen is introduced therein as a carrier gas. AS TMG and $NH_3$ react with each other, gallium nitride (GaN) grows on a seed crystal. According to this method, all the materials can be introduced into the reaction ampoule in the form of gas, whereby the film thickness can be controlled more precisely as compared with the hydride vapor epitaxy growth method.

SUMMARY OF THE INVENTION

However, the above-mentioned conventional hydride vapor epitaxy growth method and organic metal vapor phase epitaxy method have problems as follows. Namely, if group III-V compound semiconductors such as GaN are grown by the hydride vapor phase epitaxy method and organic metal vapor phase epitaxy method, then chlorine and hydrogen, which are no components of the group III-V compound semiconductors, will remain in the reaction ampoule as HCl, $NH_3$, $H_2$ and the like, which are required to be let out of the reaction ampoule via an outlet. Namely, a so-called open ampoule method is employed in the hydride vapor epitaxy growth method and the organic metal vapor epitaxy growth method. As a consequence, most of the materials do not contribute to the growth and are discarded, whereby these methods are problematic in that the material efficiency is low. Also, for discarding a large amount of HCl, $NE_3$, $H_2$, and the like, a large-scale detoxification system is needed, which increases the cost. Namely, these methods are not suitable for making single crystals at a low cost.

In the so-called closed ampoule method, on the other hand, byproducts and the like are not let out, whereby the material efficiency is not so low as that in the hydride vapor epitaxy growth method and the organic metal vapor epitaxy growth method- However, while the growth rate has been required to improve in the field of making III-V compound semiconductors in recent years, no improvement in growth rate is expected in the closed ampoule method in which no material gases are supplied from the outside, since the amount of transportation of material gases is small.

In view of such circumstances, it is an object of the present invention to provide a group III-V nitride semiconductor growth method and vapor phase growth apparatus having a high material efficiency and a high growth rate.

In one aspect, the present invention provides a group III-V nitride semiconductor growth method for growing a group III-V nitride semiconductor on a seed crystal disposed within a reaction ampoule, the method comprising the steps of plasma-exciting nitrogen continuously introduced into the reaction ampoule and evaporating a group III element disposed within the reaction ampoule; and causing thus plasma-excited nitrogen and evaporated group III element to react with each other, so as to grow the III-V nitride semiconductor on the seed crystal.

In the group III-V nitride semiconductor growth method in accordance with this aspect of the present inventions nitrogen ($N_2$) introduced into the reaction ampoule is excited so as to attain a plasma state, whereas a group III (group 3B) element such as gallium (Ga), for example, is evaporated within the reaction ampoule. As thus plasma-excited nitrogen and evaporated group III element react with each other, a group III-V nitride semiconductor such as gallium nitride (GaN)), for example, can be grown on the seed crystal. Here, since nitrogen is excited so as to attain a plasma state in this aspect of the present invention, it is more likely to react with the group III element as compared with a nitrogen molecule state in which the bonding strength between atoms is higher, and it can successively be introduced into the reaction ampoule unlike the case employing the closed ampoule method, whereby the growth rate of group III-V nitride semiconductor can be enhanced. Also, in this aspect of the present invention, only the group III element and nitrogen are used for growing the group III-V nitride semiconductor, and all the group III element and nitrogen contribute to growing the group III-V nitride semiconductor. Namely, no byproducts are generated upon growing the group III-V nitride semiconductor, whereby it is unnecessary to let out gases from within the reaction ampoule, whereby the material efficiency can be improved.

Preferably, in this aspect of the present invention, positive and negative pulsed voltages are alternately applied between two electrodes, so as to plasma-excite nitrogen between the electrodes.

In this case, since the positive and negative pulsed voltages are applied between the electrodes, an intermittent signal with a break between individual pulses is generated, whereby, as compared with the case where a continuous sine wave of high-frequency voltage is applied, the discharging phenomenon would not yield corona discharge, and nitrogen is more likely to be plasma-excited.

In another aspect, the present invention provides a group III-V nitride semiconductor growth method for growing a group III-V nitride semiconductor on a seed crystal disposed within a reaction ampoule, the method comprising the steps of causing nitrogen continuously introduced into the reaction ampoule to react with hydrogen within the reaction ampoule upon plasma excitation, so as to generate a hydride of nitrogen, and causing the hydride of nitrogen and a group III element evaporated within the reaction ampoule to react with each other, so as to grow the group III-V nitride semiconductor on the seed crystal; and then causing hydrogen generated upon growing the group III-V nitride semiconductor and nitrogen continuously introduced into the reaction ampoule to react with each other upon plasma excitation, so as to generate a hydride of nitrogen.

In the group III-V nitride semiconductor growth method in accordance with this aspect of the present invention, nitrogen continuously introduced into the reaction ampoule is caused to react with hydrogen within the reaction ampoule by plasma excitation, so as to generate a hydride of nitrogen such as NH, $NH_2$, $NH_3$, or the like. Within there action ampoule, on the other hand, a group all element such as gallium, for example, is evaporated. Then, the hydride of nitrogen and thus evaporated group III element react with each other, so that a group III-V nitride semiconductor such as gallium nitride grows on the seed crystal. Here, in this aspect of the present invention, since nitrogen diffuses into the vicinity of the seed crystal as a hydride such as $NH_x$ (X=1 to 3) and reacts with the group III element, it is more likely to react with the group III element as compared with a nitrogen molecule state in which the bonding strength between atoms is higher, and it can successively be introduced into the reaction ampoule by an amount equal to that required for the reaction unlike the case employing the closed ampoule method, whereby the growth rate of group III-V nitride semiconductor can be enhanced.

When a group III-V nitride semiconductor is grown upon the reaction between the hydride of nitrogen and the group III element, hydrogen which is no component of the group III-V nitride semiconductor is generated. Then, this hydrogen and nitrogen introduced into the reaction ampoule are caused to react with each other by plasma excitation, so as to generate again a hydride of nitrogen such as NH. Thereafter, this hydride of nitrogen and the evaporated group III element are caused to react with each other, whereby the group III-V nitride semiconductor can further be grown on the seed crystal. Namely, since hydrogen, which is no component of the group III-V nitride semiconductor, can repeatedly be utilized as being circulated within the reaction ampoule, it is unnecessary to let out gases from within the reaction ampoule, whereby the material efficiency can be improved in this aspect of the present invention.

Preferably, in this aspect of the present invention, positive and negative pulsed voltages are alternately applied between two electrodes, so as to cause nitrogen and hydrogen to react with each other upon plasma excitation between the electrodes.

In this case, since the positive and negative pulsed voltages are applied between the electrodes, an intermittent signal with a break between individual pulses is generated, whereby, as compared with the case where a continuous sine wave of high-frequency voltage is applied, the discharging phenomenon would not yield corona discharge, and nitrogen and hydrogen are more likely to react with each other upon plasma excitation.

In another aspect, the present invention provides a group III-V nitride semiconductor growth method for growing a group III-V nitride semiconductor on a seed crystal disposed within a reaction ampoule, the method comprising the steps of causing a group III element disposed within the reaction ampoule and a halogen molecule or halide to react with each other, so as to generate a halide of the group III element, and causing the halide of the group III element and plasma-excited nitrogen to react with each other, so as to grow the group III-V nitride semiconductor on the seed crystal; and then causing the halogen molecule or halide generated when growing the group III-V nitride semiconductor and the group III element disposed within the reaction ampoule to react with each other, so as to generate a halide of the group III element.

In the group III-V nitride semiconductor growth method in accordance with this aspect of the present invention, while nitrogen introduced into the reaction ampoule is excited so as to attain a plasma state, a group III element such as gallium disposed within the reaction ampoule and a halogen molecule such as $Cl_2$ or a halide such as HCl are caused to react with each other, so as to generate a halide of the group III element such as gallium chloride (GaCl). As plasma-excited nitrogen and the halide of group III element are caused to react with each other, a group III-V nitride semiconductor such as gallium nitride, for example, can be grown on the seed crystal. Here, since nitrogen is excited so as to attain a plasma state, it is more likely to react with the group III element as compared with a nitrogen molecule state in which the bonding strength between atoms is higher, and it can successively be introduced into the reaction ampoule unlike the case employing the closed ampoule method, whereby the growth rate of group III-V nitride semiconductor can be enhanced. Further, since the group III element such as Ga is transported as a halide such as GaCl having a high equilibrium vapor pressure to the vicinity of the seed crystal, its transportation speed is faster than that in the case where the group III element is evaporated so as to reach the vicinity of the seed crystal, whereby the growth rate of group III-V nitride semiconductor can be enhanced.

When the group III-V nitride semiconductor is grown by the reaction between plasma-excited nitrogen and the halide of group III element, a halogen which is no component of the group III-V nitride semiconductor is generated as a halogen molecule or halide. Then, this halogen molecule or halide and the group III element such as gallium disposed within the reaction ampoule react with each other, so as to generate a halide of the group III element again, Thereafter, this halide of group III element and plasma-excited nitrogen can be caused to react with each other, so as to further grow the group III-V nitride semiconductor on the seed crystal. Namely, since a halogen, which is no component of the group III-V nitride semiconductor, can repeatedly be utilized as being circulated within the reaction ampoule, it is unnecessary to let out gases from within the reaction ampoule, whereby the material efficiency can be improved in this aspect of the present invention, Preferably, in this aspect of the present invention, positive and negative pulsed voltages are alternately applied between two electrodes, so as to plasma-excite nitrogen between the electrodes.

In this case, since the positive and negative pulsed voltages are applied between the electrodes, an intermittent signal with a break between individual pulses is generated, whereby, as compared with the case where a continuous sine wave of high-frequency voltage is applied, the discharging phenomenon would not yield corona discharge, and nitrogen is more likely to be plasma-excited.

In another aspect, the present invention provides a group III-V nitride semiconductor growth method for growing a group III-V nitride semiconductor on a seed crystal disposed within a reaction ampoule, the method comprising the steps of causing nitrogen introduced into the reaction ampoule and hydrogen within the reaction ampoule to react with each other upon plasma excitation, so as to generate a hydride of nitrogen, and also causing a group III element disposed within the reaction ampoule and a halogen molecule or halide to react with each other, so as to generate a halide of the group III element, and causing the hydride of nitrogen and the halide of group III element to react with each other, so as to grow the group III-V nitride semiconductor on the seed crystal; and then causing the halogen molecule or halide generated upon growing the group III-V nitride semiconductor and the group III element disposed within the reaction ampoule to react with each other, so as to generate a halide of the group III element, and also causing hydrogen which is generated upon growing the group III-V nitride semiconductor and nitrogen to react with each other upon plasma excitation, so as to generate a hydride of nitrogen.

In the group III-V nitride semiconductor growth method in accordance with this aspect of the present invention, nitrogen introduced into the reaction ampoule and hydrogen within the reaction ampoule are caused to react with each other by plasma excitation, so as to generate a hydride of nitrogen such as NH, $NH_2$, $NH_3$, or the like, and also the group III element disposed within the reaction ampoule and a halogen molecule such as $Cl_2$ or a halide such as HCl are caused to react with each other, so as to generate a halide of the group III element such as GaCl. Then, as the hydride of nitrogen and the halide of group III element are caused to react with each other, a group III-V nitride semiconductor such as gallium nitride, for example, can be grown on the seed crystal.

Here, since nitrogen diffuses to the vicinity of the seed crystal as a hydride and reacts with the group III element, it is more likely to react with the group III element as compared with a nitrogen molecule state in which the bonding strength between atoms is higher, and it can successively be introduced into the reaction ampoule by an amount equal to that required for the reaction unlike the case employing the closed ampoule method, whereby the growth rate of group III-V nitride semiconductor can be enhanced. Further, since the group III element such as Ga is transported as a halide such as GaCl having a high equilibrium vapor pressure to the vicinity of the seed crystal, its transportation speed becomes faster, whereby the growth rate of group III-V nitride semiconductor can be made faster than that in the case where the group III element is evaporated so as to reach the vicinity of the seed crystal.

When the group III-V nitride semiconductor is grown by the reaction between the hydride of nitrogen and the halide of group III element, hydrogen which is no component of the group III-V nitride semiconductor is generated, and also a halogen is generated as a halogen molecule or halide. Then, this hydrogen and nitrogen introduced into the reaction ampoule react with each other upon plasma excitation, so as to generate a hydride of nitrogen again, and also the halogen molecule or halide and the group III element such as gallium disposed within the reaction ampoule react with each other, so as to generate a halide of the group III element again. Thereafter, thus generated hydride of nitrogen and halide of group III element are caused to react with each other, whereby the group III-V nitride semiconductor can further be grown on the seed crystal. Namely, since hydrogen and halogen, which are no components of the group III-V nitride semiconductor, can repeatedly be utilized as being circulated within the reaction ampoule, it is unnecessary to let out gases from within the reaction ampoule, whereby the material efficiency can be improved in this aspect of the present invention.

Preferably, in this aspect of the present invention, positive and negative pulsed voltages are alternately applied between two electrodes, so as to cause nitrogen and hydrogen to react with each other upon plasma excitation between the electrodes.

In this case, since the positive and negative pulsed voltages are applied between the electrodes, an intermittent signal with a break between individual pulses is generated, whereby, as compared with the case where a continuous sine wave of high-frequency voltage is applied, the discharging phenomenon would not yield corona discharge, and nitrogen and hydrogen are more likely to react with each other upon plasma excitation.

Preferably, in the above-mentioned group III-V nitride semiconductor growth methods in accordance with the present invention, nitrogen is introduced into the reaction ampoule so as to keep a substantially constant total pressure within the reaction ampoule.

In this case, even when the partial pressure of nitrogen is lowered along with the growth of group III-V nitride semiconductor, nitrogen is introduced into the reaction ampoule so as to compensate therefore, whereby the group III-V nitride semiconductor can be grown stably.

In another aspect, the present invention provides a vapor phase growth apparatus for growing a group III-V nitride semiconductor, the apparatus comprising a reaction ampoule having a container disposed therein for containing a group III element and an inlet for introducing nitrogen, excitation means for plasma-exciting nitrogen introduced from the inlet, and heating means for heating a seed crystal disposed within the reaction ampoule and the container; wherein, upon growing the group III-V nitride semiconductor on the seed crystal, nitrogen is introduced from the inlet, and no gas is let out from within the reaction ampoule.

In the vapor phase growth apparatus in accordance with the present invention, nitrogen introduced from the inlet is excited by the excitation means so as to attain a plasma state. On the other hand, the group III element such as gallium contained in the container is evaporated by the heating means. Then, nitrogen in the plasma state and the evaporated group III element react with each other, so that a group III-V nitride semiconductor such as gallium nitride, for example, can be grown on the seed crystal, Here, since nitrogen is excited so as to attain a plasma state in this aspect of the present invention, it is more likely to react with the group III element as compared with a nitrogen molecule state in which the bonding strength between atoms is higher, and it can successively be introduced into the reaction ampoule unlike the case employing the closed ampoule method, whereby the growth rate of group III-V nitride semiconductor can be enhanced. Also, since the materials used in the growth apparatus in accordance with the present invention are only the group III element and nitrogen, which are components of the group III-V nitride semiconductor, the material efficiency can be improved. Further, while no gas is let out from within the reaction ampoule when growing the group III-V nitride semiconductor, all of nitrogen introduced into the reaction ampoule during the growth is used for growing GaN, whereby gases not contributing to the growth of GaN would be kept from remaining within the reaction ampoule in this aspect of the present invention.

When growing the group III-V nitride semiconductor in the growth apparatus in accordance with the present invention, a predetermined amount of hydrogen and halogen (halogen molecule such as $Cl_2$ or halide such as HCl) may be introduced from the inlet. In this case, nitrogen introduced from the inlet into the reaction ampoule is plasma-excited by the excitation means, and further is caused to react with hydrogen, so as to generate a hydride of nitrogen such as NH, $NH_2$, or $NH_3$, and also the group III element and the halogen molecule or halide are caused to react with each other, so as to generate a halide of the group III element such as GaCl. Then, the hydride of nitrogen and the halide of group III element are caused to react with each other, whereby the group III-V nitride semiconductor such as gallium nitride, for example, can be grown on the seed crystal.

Here, since nitrogen diffuses into the vicinity of the seed crystal as a hydride such as NH and reacts with the group III element, it is more likely to react with the group III element as compared with a nitrogen molecule state in which the bonding strength between atoms is higher, and also, unlike the case employing the closed ampoule method, nitrogen is introduced into the reaction ampoule by an amount equal to that required for the reaction when growing the group III-V nitride semiconductor, whereby the growth rate can be enhanced. Further, since the group III element such as Ga is transported to the vicinity of the seed crystal as a halide such as GaCl, the growth rate of group III-V nitride semiconductor can be made faster than that in the case where the group III element is evaporated so as to reach the vicinity of the seed crystal.

When the group III-V nitride semiconductor is grown by the reaction between the hydride of nitrogen and the halide of group III element, hydrogen which is not component of the group III-V nitride semiconductor is generated, and also a halogen is generated as a halogen molecule or halide. Thus generated hydrogen and halogen molecule or halide would not be let out of the reaction ampoule when growing the group III-V nitride semiconductor. Then, hydrogen and nitrogen react with each other upon plasma excitation, so as to generate a hydride of nitrogen again, and also the halogen molecule or halide and the group III element such as gallium disposed within the reaction ampoule react with each other, so as to generate a halide of the group III element again. Thereafter, thus generated hydride of nitrogen and halide of group III element react with each other, whereby the group III-V nitride semiconductor further grows on the seed crystal. Namely, since hydrogen and the halogen, which are no components of the group III-V nitride semiconductor, can repeatedly be utilized as being circulated within the reaction ampoule, the material efficiency can be improved.

Preferably, in the vapor phase growth apparatus of the present invention, the excitation means has two electrodes, and a high-frequency power source for alternately applying positive and negative pulsed voltages between the electrodes.

In this case, since the high-frequency power source applies positive and negative pulsed voltages between the electrodes, an intermittent signal with a break between individual pulses is generated, whereby, as compared with the case where a continuous sine wave of high-frequency voltage is applied, the discharging phenomenon would not yield corona discharge, and nitrogen is more likely to be plasma-excited.

DETAILED DESCRIPTION OF THE PREFERRED EMBODIMENTS

In the following, preferred embodiments of the group III-V nitride semiconductor growth method and apparatus in accordance with the present invention will be explained in detail with reference to the accompanying drawings. Here, constituents identical to each other will be referred to with numerals identical to each other without repeating their overlapping explanations.

First Embodiment

Figure 1:
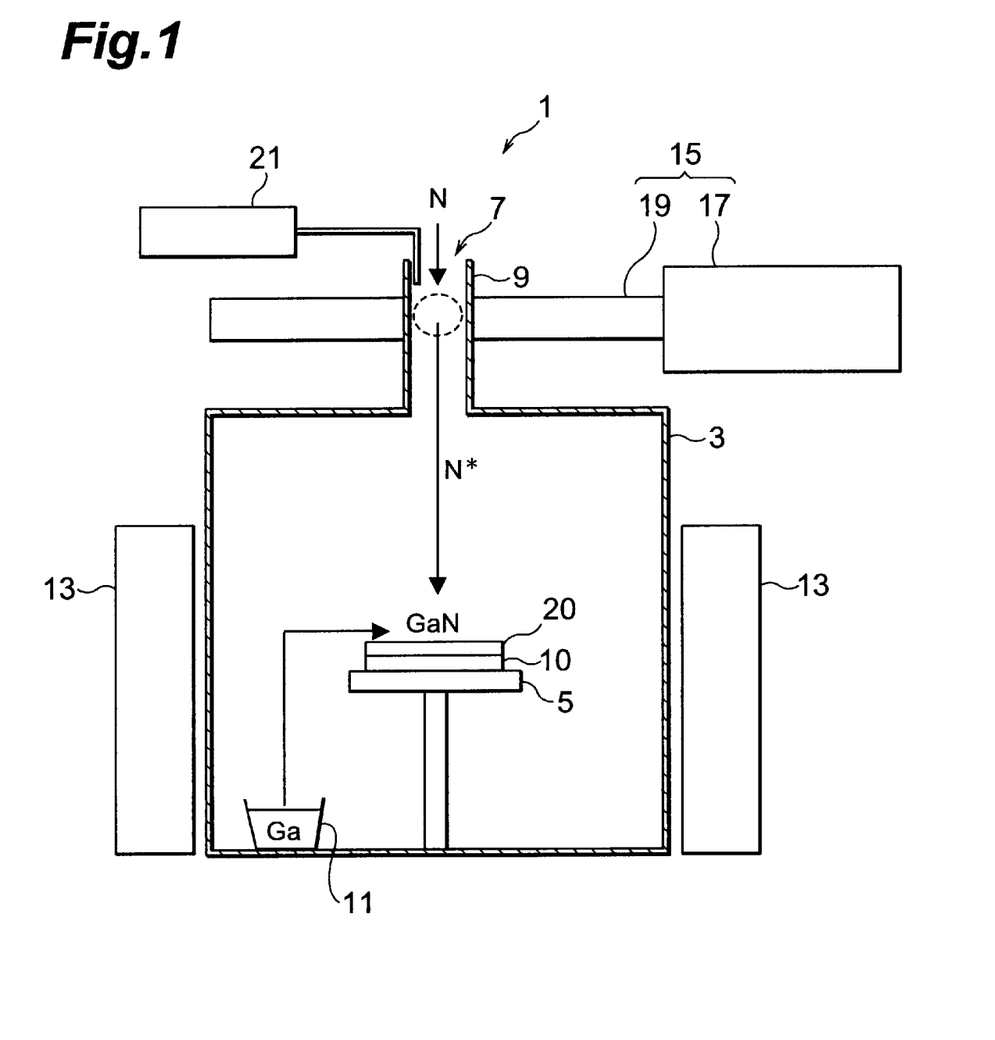
FIG. 1 is an explanatory view of a first embodiment of the group III-V nitride semiconductor growth method and vapor phase growth apparatus in accordance with the present invention.

FIG. 1 is a view showing a vapor phase growth apparatus 1 for growing a group III-V nitride semiconductor in accordance with this embodiment. The vapor phase growth apparatus 1 of this embodiment is used for growing gallium nitride (GaN), which is a group III-V nitride semiconductor, on a seed crystal 10 made of sapphire and supported on a seed crystal support table 5 within a reaction tube (reaction ampoule) 3 made of silica. As depicted, the upper face of the reaction tube 3 is formed with an inlet port 9 having an inlet 7 for introducing nitrogen ($N_2$), whereas a container 11 for containing gallium (Ga), which is a group III (group 3B) element, is disposed within the reaction tube 3. Further, the reaction tube 3 is surrounded by a heater 13 for heating Ga within the container 11, the vicinity of the seed crystal 10, and the reaction tube 3.

For enhancing the uniformity in temperature in the radial direction of the seed crystal 10, the reaction tube 3 is made as a vertical furnace. Further, the reaction tube 3 is configured such that it can communicate gases to the outside only through the inlet 7.

Also, the vapor phase growth apparatus 1 is provided with an excitation unit 15 for exciting nitrogen introduced into the inlet port 9 so as to make it attain a plasma state. The excitation unit 15 is constituted by an oscillator 17 for generating a microwave with a frequency of 2.45 GHz, and a waveguide 19 through which the microwave from the oscillator 17 propagates. For introducing the microwave into the inlet port 9, the latter penetrates through the waveguide 19.

Further, the vapor phase growth apparatus 1 is provided with a pressure gauge 21 for measuring the pressure therein. Under the control of a control unit which is not depicted, nitrogen at a flow rate corresponding to the pressure within the reaction tube 3 measured by the pressure gauge 21 is introduced into the reaction tube 3 by way of the inlet port 9.

With reference to FIG. 1, a method of growing GaN by use of the vapor phase growth apparatus 1 will now be explained.

Before introducing nitrogen from the inlet port 9, the heater 13 is initially actuated, such that the temperature in the vicinity of the seed crystal 10 becomes about 1000° C., and the temperature of the container 11 for Ga becomes about 1100° C. As a consequence, Ga within the container 11 is evaporated. Also, while the oscillator 17 is actuated so as to generate a microwave at 2.45 GHz, this microwave becomes a standing wave within the waveguide 19.

Subsequently, nitrogen at a flow rate of about $1\times10^{-3}$ 1/min on the basis of its normal gas state with a total pressure of about 10 Pa to about 4000 Pa is started to be introduced into the reaction tube 3 from the inlet 7. Nitrogen would be continuously supplied into the reaction tube 3 until GaN is completely grown. Also, nitrogen passing through the inlet port 9 is excited by the microwave advancing through the waveguide 19, so as to attain a plasma state. Nitrogen in the plasma state can take various forms such an atom and molecule forms, which will hereinafter be collectively referred to as nitrogen plasma for convenience. Also, in the nitrogen plasma, only N* (nitrogen radical) is depicted, without showing ion-like plasmas such as $N_2^+$ and $N_2^-$.

Evaporated Ga and the nitrogen plasma each diffuse so as to reach the vicinity of the seed crystal 10, As they react with each other, a GaN layer 20 can be grown on the seed crystal 10. Though the partial pressure of nitrogen within the reaction tube 3 is about to decrease as the GaN layer 20 grows, the unshown control unit determines the flow rate of nitrogen introduced into the inlet port 9 according to the pressure data from the pressure gauge 21 so as to compensate for the decrease, whereby the total pressure within the reaction tube 3 can be kept substantially constant. Therefore, the GaN layer 20 can be grown stably. Furthermore, because the reaction tube 3 is heated by the heater 13, the GaN is not grown on the inner wall of the reaction tube 3 but on the seed crystal 10.

In this embodiment, since nitrogen within the reaction tube 3 is excited so as to attain a plasma state which is highly reactive, it is more likely to react with Ga as compared with a nitrogen molecule ($N_2$) state in which the bonding strength between atoms is higher, and it can successively be introduced into the reaction tube 3 unlike the case employing the closed ampoule method, whereby the growth rate of the GaN layer 20 can be enhanced. Experiments carried out by the inventors have revealed that, while the growth rate of GaN layer was 1 μm/hr or less when nitrogen was not excited so as to attain the plasma state, it was about 100 μm/hr in accordance with the method of this embodiment. Also, since only Ga and nitrogen, which are components of the GaN layer 20, are used as the raw materials for GaN in this embodiment, it is not necessary to let out gases from within the reaction tube 3 as in the open ampoule method employed in the hydride vapor epitaxy growth method and organic metal vapor epitaxy growth method, whereby the material efficiency can be improved. Here, according to experiments carried out by the inventors, substantially all of nitrogen introduced into the reaction tube 3 contributed to crystal growth, whereby the material efficiency was 80% or higher.

If an AlGaN layer, an InGaN layer, and the like are laminated on a substrate made of thus grown GaN, then a blue LED and the like can be manufactured. If the chip surface of such a blue LED is coated with a YAG type phosphor, then a white LED can be realized.

Second Embodiment

Figure 2:
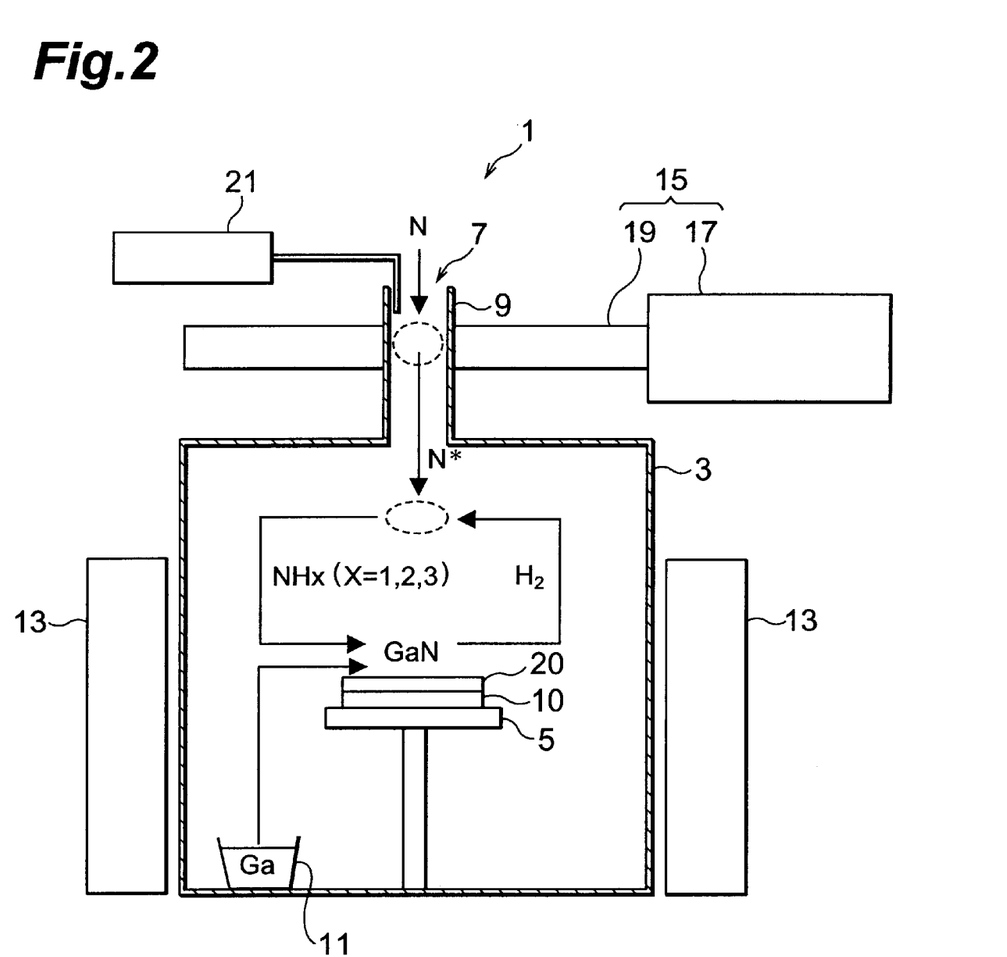
FIG. 2 is a view used for explaining a second embodiment of the group III-V nitride semiconductor growth method in accordance with the present invention.

With reference to FIG. 2, a second embodiment of the group III-V nitride semiconductor growth method in accordance with the present invention will now be explained. In this embodiment, a vapor phase growth apparatus 1 similar to that of the first embodiment is used.

For growing a GaN layer 20 by the growth method of this embodiment, nitrogen ($N_2$) is initially started to be introduced into the reaction tube 3 by way of the inlet port 9, and then hydrogen ($H_2$) is introduced therein by a predetermined amount. Nitrogen is continuously supplied into the reaction tube 3 until GaN is completely grown. Subsequently, as in the first embodiment, Ga within the container 11 is evaporated, and also nitrogen introduced from the inlet 7 is excited so as to become a nitrogen plasma. Then, as shown in FIG. 2, the nitrogen plasma and hydrogen react with each other, whereby $NH_x$ (X=1, 2, 3), ions thereof, their plasma-state products, and the like are generated. These will hereinafter be referred to as $NH_x$. While there are cases where hydrogen within the reaction tube 3 flows into the inlet port and thereby attains a plasma state, "reaction between the nitrogen plasma and hydrogen" in this embodiment encompasses the case where thus generated hydrogen plasma and the nitrogen plasma react with each other.

Then, $NH_x$ having reached near the seed crystal 10 and evaporated Ga react with each other, whereby the GaN layer 20 grows on the seed crystal 10. Here, since nitrogen flows so as to diffuse into the vicinity of the seed crystal 10 and reacts with Ga, it is more likely to react with Ga as compared with a nitrogen molecule ($N_2$) state in which the bonding strength between atoms is higher, and it can successively be introduced into the reaction tube 3 unlike the case employing the closed ampoule method, whereby the growth rate of the GaN layer 20 can be enhanced. In practice, when an experiment was carried out with the amount of introduction of hydrogen being set to 30% with respect to the total gas content within the reaction tube 3, the growth rate of GaN layer 20 was about 150 μm/hr.

When the GaN layer 20 is grown by the reaction between $NH_x$ and Ga, hydrogen ($H_2$), which is no component of GaN, is generated. Since the vapor phase growth apparatus 1 of this embodiment is provided with no outlet, thus generated hydrogen is not let out. Then, thus generated hydrogen ($H_2$) and the nitrogen plasma newly supplied into the reaction tube 3 by way of the inlet port 9 are caused to react with each other, so as to generate again the hydride of nitrogen and its ions. Thereafter, thus generated $NH_x$ and evaporated Ga react with each other, whereby the GaN layer 20 on the seed crystal 10 can further be made thicker. Namely, since hydrogen ($H_2$), which is no component of GaN, can be repeatedly utilized as being circulated within the reaction tube 3, it is unnecessary to let out the gases from within the reaction tube 3, whereby the material efficiency can be improved. In practice, when the GaN layer was grown by the method of this embodiment, the material efficiency was about 80%.

Though the partial pressure of nitrogen within the reaction tube 3 is about to decrease as the GaN layer 20 grows, the unshown control unit determines the flow rate of nitrogen introduced into the inlet port 9 according to the pressure data from the pressure gauge 21 so as to compensate for the decrease, as in the first embodiment, whereby the total pressure within the reaction tube 3 can be kept substantially constant. Therefore, the GaN layer 20 can be grown stably.

Third Embodiment

Figure 3:
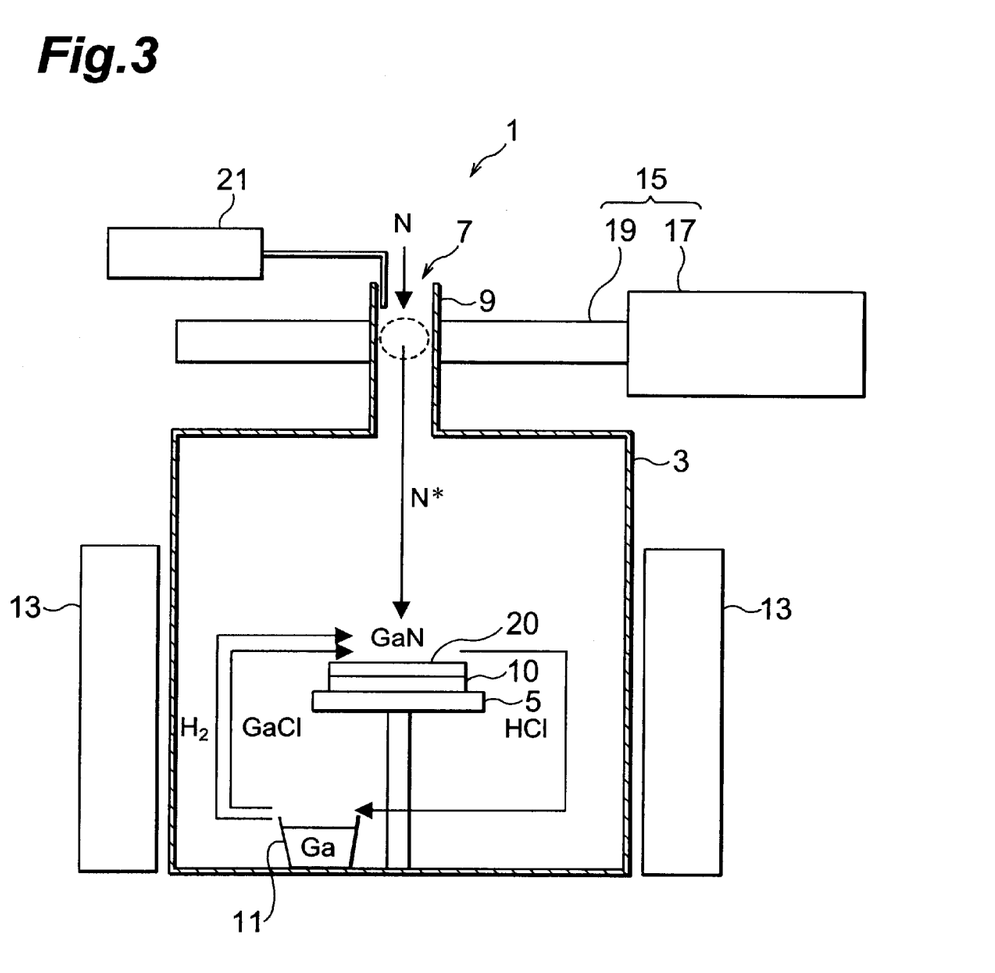
FIG. 3 is a view used for explaining a third embodiment of the group III-V nitride semiconductor growth method in accordance with the present invention.

With reference to FIG. 3, a third embodiment of the group III-V nitride semiconductor growth method in accordance with the present invention will now be explained. In this embodiment, a vapor phase growth apparatus 1 similar to that of each of the above-mentioned embodiments is used.

First, nitrogen introduced from the inlet 7 is excited so as to become a nitrogen plasma, and the heater 13 is actuated so as to evaporate Ga. Nitrogen is continuously introduced into the reaction tube 3 until GaN is completely grown. Subsequently, hydrogen chloride (HCl), which is a halide, is introduced into the reaction tube 3 from the inlet 7 by a predetermined amount at a partial pressure of 10 Pa to 500 Pa. Then, HCl having flowed to the bottom part of the reaction tube 3 under the influence of partial pressure reacts with Ga within the container 11, whereby gallium chloride (GaCl), which is a halide of the group III element, and hydrogen ($H_2$) are generated. Further, due to the difference in vapor pressure between the vicinity of the container 11 and the vicinity of the seed crystal 10, GaCl and $H_2$ reach the seed crystal 10. Then, as the above-mentioned nitrogen plasma and GaCl react with each other, a GaN layer 20, which is a group III-V nitride semiconductor, is grown on the seed crystal 10.

Here, since nitrogen is excited so as to become a nitrogen plasma, it is more likely to react with Ga as compared with a nitrogen molecule ($N_2$) state in which the bonding strength between atoms is higher, and it can successively be introduced into the reaction tube 3 unlike the case employing the closed ampoule method, whereby the growth rate of GaN layer 20 can be enhanced. Further, since Ga is transported to the vicinity of the seed crystal 10 as GaCl, which is a halide having a high equilibrium vapor pressure, its transportation speed becomes faster than that in the case where Ga is evaporated so as to reach the vicinity of the seed crystal 10 as in the first and second embodiments, whereby the growth rate of GaN layer 20 can be enhanced. In practice, when an experiment was carried out with the amount of introduction of HCl being set to 10% with respect to the total gas content within the reaction tube 3, the growth rate of GaN layer 20 was about 160 $\mu$m/hr.

On the other hand, the halogen (Cl), which is no component of GaN, generated when the GaN layer 20 is grown by the reaction between the nitrogen plasma and GaCl, and hydrogen ($H_2$) introduced from the inlet 7 or hydrogen ($H_2$) generated at the same time when GaCl is generated react with each other, whereby hydrogen chloride (HCl) is generated. Here, there are cases where chlorine does not react with hydrogen and is generated as a halogen molecule ($Cl_2$). Since the vapor phase growth apparatus 1 of this embodiment is provided with no outlet, thus generated HCl and $Cl_2$ would not be let out. Then, thus generated HCl or $Cl_2$ reacts with Ga disposed within the reaction tube 3, whereby GaCl is generated again. Thereafter, thus generated GaCl and the nitrogen plasma can be caused to react with each other, so as to further thicken the GaN layer 20 on the seed crystal 10. Namely, since the halogen (Cl), which is no component of GaN, can be repeatedly utilized as being circulated within the reaction tube 3 in this embodiment, it is unnecessary to let out the gases from within the reaction tube 3, whereby the material efficiency can be improved.

Not only Cl but also Br, I, or the like may be used as the halogen circulated within the reaction tube 3 in this embodiment. Also, chlorine ($Cl_2$), bromine ($Br_2$), iodine ($I_2$), or the like may be introduced into the reaction tube 3 as a halogen molecule instead of hydrogen chloride (HCl).

Though the partial pressure of nitrogen within the reaction tube 3 is about to decrease as the GaN layer 20 grows, the unshown control unit determines the flow rate of nitrogen introduced into the inlet port 9 according to the pressure data from the pressure gauge 21 so as to compensate for the decrease, as in each of the above-mentioned embodiments, whereby the total pressure within the reaction tube 3 can be kept substantially constant. Therefore, the GaN layer 20 can be grown stably.

Fourth Embodiment

Figure 4:
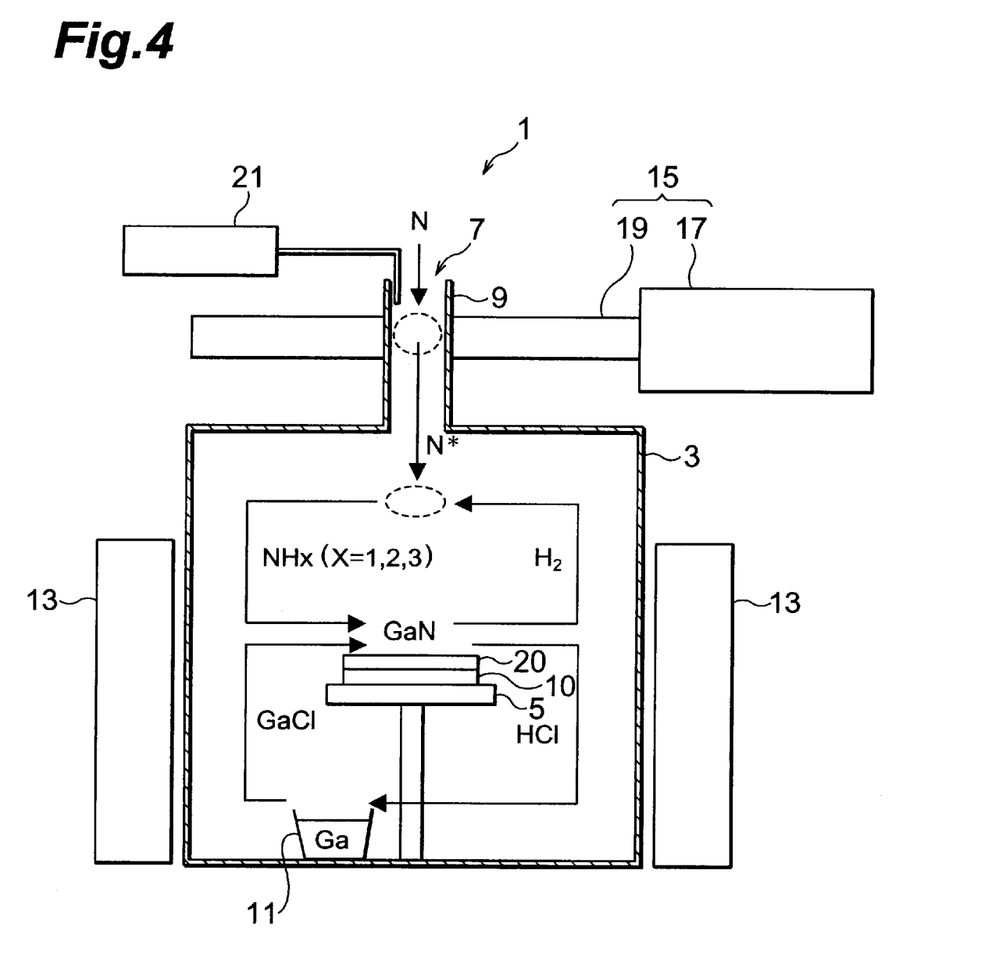
FIG. 4 is a view used for explaining a fourth embodiment of the group III-V nitride semiconductor growth method in accordance with the present invention.

With reference to FIG. 4, a fourth embodiment of the group III-V nitride semiconductor growth method in accordance with the present invention will now be explained. In this embodiment, a vapor phase growth apparatus 1 similar to that of each of the above-mentioned embodiments is used.

For growing a GaN layer 20 by the growth method of this embodiment, nitrogen ($N_2$) is initially started to be introduced into the reaction tube 3 by way of the inlet port 9, and then hydrogen chloride (HCl) and hydrogen ($H_2$) are introduced therein by a predetermined amount as in the third embodiment. Nitrogen would be continuously supplied into the reaction tube 3 until GaN is completely grown. Subsequently, Ga within the container 11 is evaporated, and nitrogen introduced from the inlet 7 is excited so as to become a nitrogen plasma. Then, as shown in FIG. 4, the nitrogen plasma and hydrogen ($H_2$) react with each other, whereby $NH_x$ is generated. Also, HCl having flowed to the bottom part of the reaction tube 3 under the influence of partial pressure reacts with Ga within the container 11, whereby gallium chloride (GaCl), which is a halide of a group III element, and hydrogen ($H_2$) are generated (though the flow of hydrogen at this time is not depicted).

Due to the difference in vapor pressure between the vicinity of the container 11 and the vicinity of the seed crystal 10, thus generated GaCl and $NH_x$ reach the seed crystal 10. Then, as GaCl and $NH_x$ react with each other, the GaN layer 20, which is a group III-V nitride semiconductor, is grown on the seed crystal 10.

Here, since nitrogen flows to the vicinity of the seed crystal 10 as $NH_x$, which is a hydride, and reacts with Ga, it is more likely to react with Ga as compared with a nitrogen molecule ($N_2$) state in which the bonding strength between atoms is higher, and it can successively be introduced into the reaction tube 3 unlike the case employing the closed ampoule method, whereby the growth rate of GaN layer 20 can be enhanced. Further, since Ga is transported to the vicinity of the seed crystal 10 as GaCl, which is a halide having a high equilibrium vapor pressure, its transportation speed becomes faster than that in the case where Ga is evaporated so as to reach the vicinity of the seed crystal 10 as in the first and second embodiments, whereby the growth rate of GaN layer 20 can be enhanced. In practice, when an experiment was carried out with the amounts of introduction of hydrogen and HCl being set to 50% and 10% with respect to the total gas content within the reaction tube 3, respectively, the growth rate of GaN layer 20 was about 200 $\mu$m/hr.

When the GaN layer 20 is grown by the reaction between GaCl and $NH_x$, hydrogen ($H_2$), which is no component of GaN, and hydrogen chloride (HCl), which is a halide, are generated. Here, there are cases where chlorine does not react with hydrogen and is generated as a halogen molecule ($Cl_2$). Since the vapor phase growth apparatus 1 of this embodiment is provided with no outlet, thus generated $H_2$ HCl, and the like would not be let out. Then, thus generated hydrogen ($H_2$) and the nitrogen plasma newly supplied into the reaction tube 3 by way of the inlet port 9 react with each other, whereby $NH_x$ is generated again. On the other hand, hydrogen chloride (HCl) or chlorine ($Cl_2$) and Ga contained in the container 11 react with each other, whereby GaCl is generated again.

Thereafter thus regenerated GaCl and $NH_x$ can be caused to react with each other, so as to further thicken the GaN layer 20 on the seed crystal 10. Namely, since hydrogen ($H_2$) and the halogen (Cl), which are no components of GaN, can be repeatedly utilized as being circulated within the reaction tube 3 in this embodiment, it is unnecessary to let out the gases from within the reaction tube 3, whereby the material efficiency can be improved. In practice, when the GaN layer was grown by the method of this embodiment, the material efficiency was 80% or higher.

As in the third embodiment, not only Cl but also Br, I, or the like may be used as the halogen circulated within the reaction tube 3 in this embodiment. Also, chlorine ($Cl_2$), bromine ($Br_2$), iodine ($I_2$), or the like may be introduced into the reaction tube 3 as a halogen molecule instead of hydrogen chloride (HCl).

Though the partial pressure of nitrogen within the reaction tube 3 is about to decrease as the GaN layer 20 grows, the unshown control unit determines the flow rate of nitrogen introduced into the inlet port 9 according to the pressure data from the pressure gauge 21 so as to compensate for the decrease, as in each of the above-mentioned embodiments, whereby the total pressure within the reaction tube 3 can be kept substantially constant. As a consequence, the GaN layer 20 improves its yield of single crystallization and can be grown stably.

Fifth Embodiment

Figure 5:
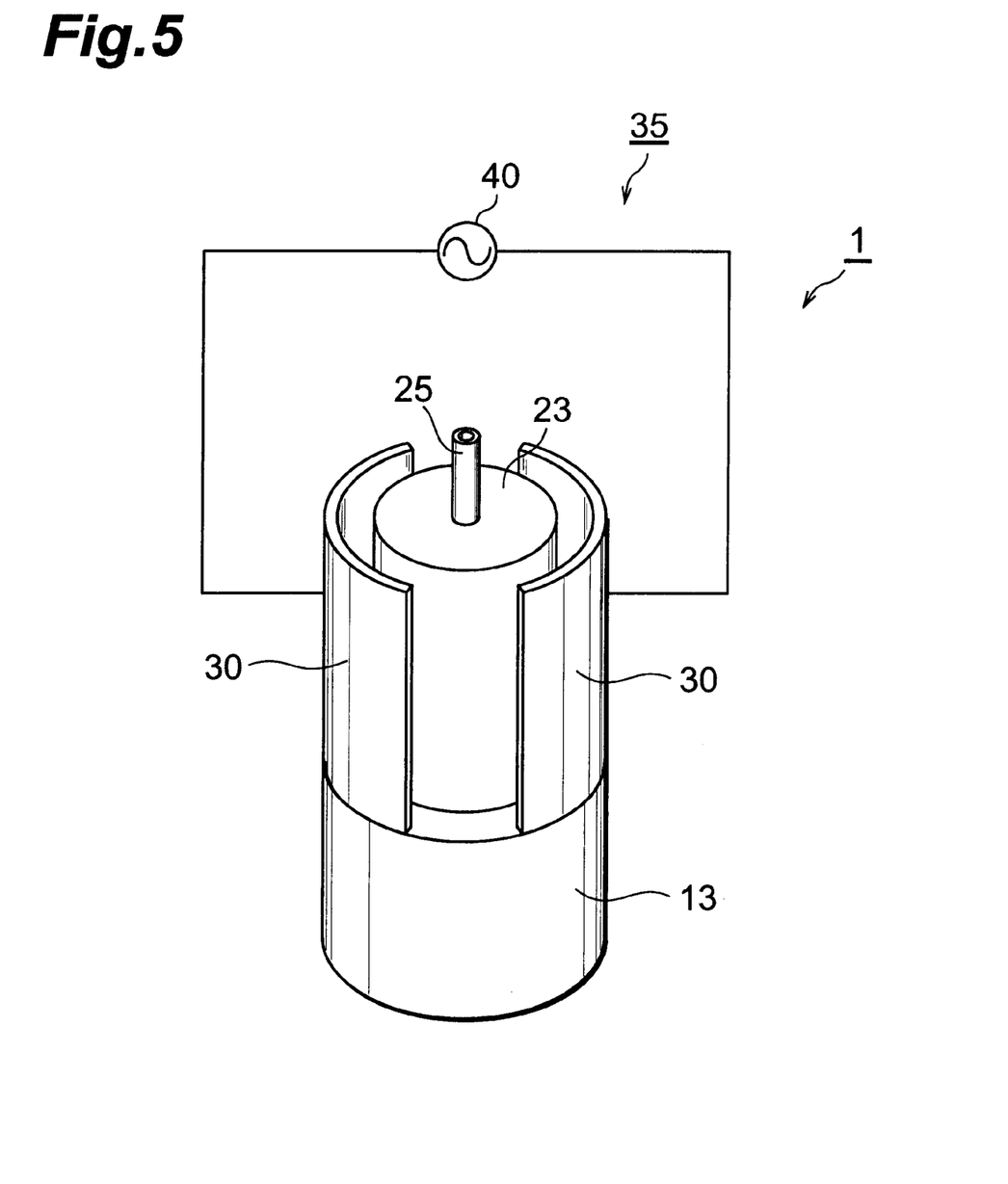
FIG. 5 is a view used for explaining a fifth embodiment of the group III-V nitride semiconductor growth method in accordance with the present invention.

With reference to FIG. 5, a fifth embodiment of the group III-V nitride semiconductor growth method in accordance with the present invention will now be explained. This embodiment differs from the first embodiment in the configuration of the excitation unit for exciting nitrogen so as to make it attain a plasma state. The excitation unit 35 of the vapor phase growth apparatus 1 of this embodiment comprises two electrodes 30, 30, each shaped like a flexed plate, opposing each other so as to surround a reaction tube 23; and a high-frequency power source 40 for applying high-frequency, high voltages between these electrodes 30, 30.

The reaction tube 23 used in this embodiment has substantially a circular columnar form, whereas an inlet tube 25 for introducing nitrogen therein is inserted into its upper face at the center thereof. The lower part of the reaction tube 23 is surrounded by a heater 13 similar to that of the first embodiment. Though not depicted, a seed crystal 10 and a container 11 for containing Ga are disposed within the reaction tube 23 as in the first embodiment (see FIG. 1).

Figure 6:
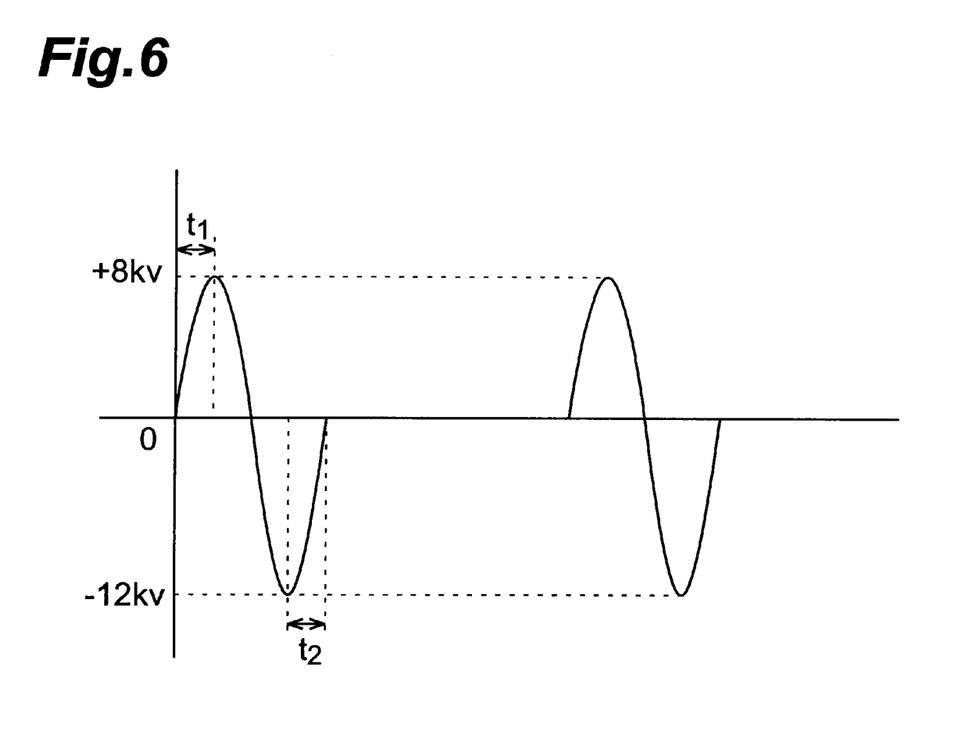
FIG. 6 is a graph showing voltages applied between electrodes by the high-frequency power source shown in FIG. 5.

FIG. 6 is a graph showing voltages applied between the electrodes 30, 30 by the high-frequency power source 40. As shown in this graph, the high-frequency power source 40 alternately applies positive and negative pulsed voltages between the electrodes 30, 30. Also, a break is formed between individual pulses, whereby a so-called intermittent signal is generated. Further, each of rise time $t_1$ and fall time $t_2$ is relatively short, i.e., 1.25 $\mu$sec, while the frequency is variable within the range of 1 kHz to 100 kHz. Also, the positive and negative pulsed voltages are +8 kv and −12 kv, thus forming asymmetrical waveforms.

For growing a GaN layer on the seed crystal 10 in such a configuration, temperature is initially set in the heater 13 under a condition similar to that in the first embodiment, so as to evaporate Ga, and then nitrogen is introduced into the reaction tube 23 from the inlet tube 25. Nitrogen is continuously supplied into the reaction tube 23 until GaN is completely grown. Also, nitrogen having reached between the electrodes 30, 30 after being introduced into the reaction tube 23 from the inlet tube 25 is excited by the high-frequency, high voltages applied by the high-frequency power source 40, so as to become a nitrogen plasma.

Unlike conventional techniques in which a continuous sine wave of high-frequency voltage is applied between electrodes, this embodiment uses a power source applying positive and negative pulsed voltages with a break between individual pulses, whereby the discharging phenomenon does not yield corona discharge, so that nitrogen is likely to become a nitrogen plasma. Also, since pulse signals have a high rising speed, the electric field strength per unit area is high, whereby nitrogen is likely to be excited so as to become a nitrogen plasma.

Further since the reaction tube 23 positioned between the electrodes 30, 30 is formed from silica, which is a dielectric, an electric field can uniformly be generated between the electrodes 30, 30. As a consequence, abnormal discharge can be prevented from occurring, so that plasmas can be generated more stably and effectively.

While a process using an inactive gas under a low pressure has conventionally been known as a technique for plasma discharge, plasmas can be generated even at normal pressure if the high-frequency power source 40 of this embodiment is used.

Further, when a microwave is used as in the first embodiment, it is necessary that the size of the inlet port 9 be made smaller so that the microwave does not leak out from the inlet port 9, whereby it requires labor to design and make the reaction tube 23. In the fifth embodiment, by contrast, the inlet tube 25 can be formed with a desirable size, whereby it becomes easier to design and make the reaction tube 23.

Though plasmas mainly occur between the electrodes 30, 30, the excitation unit 35 of this embodiment can change the electrode forms more freely, as shown in FIG. 5 and FIGS. 7 to 9 which will be explained in the following, as compared with other plasma generating means, whose forms are harder to change, such as those of RF, ECR, and microwaves. Thus, this embodiment is advantageous in that, while the seed crystal is disposed at a desirable place, plasmas can be generated nearby.

Thus excited nitrogen plasma and evaporated Ga each diffuse so as to reach the vicinity of the seed crystal 10. As they react with each other, the GaN layer 20 can be grown on the seed crystal 10.

Figure 7:
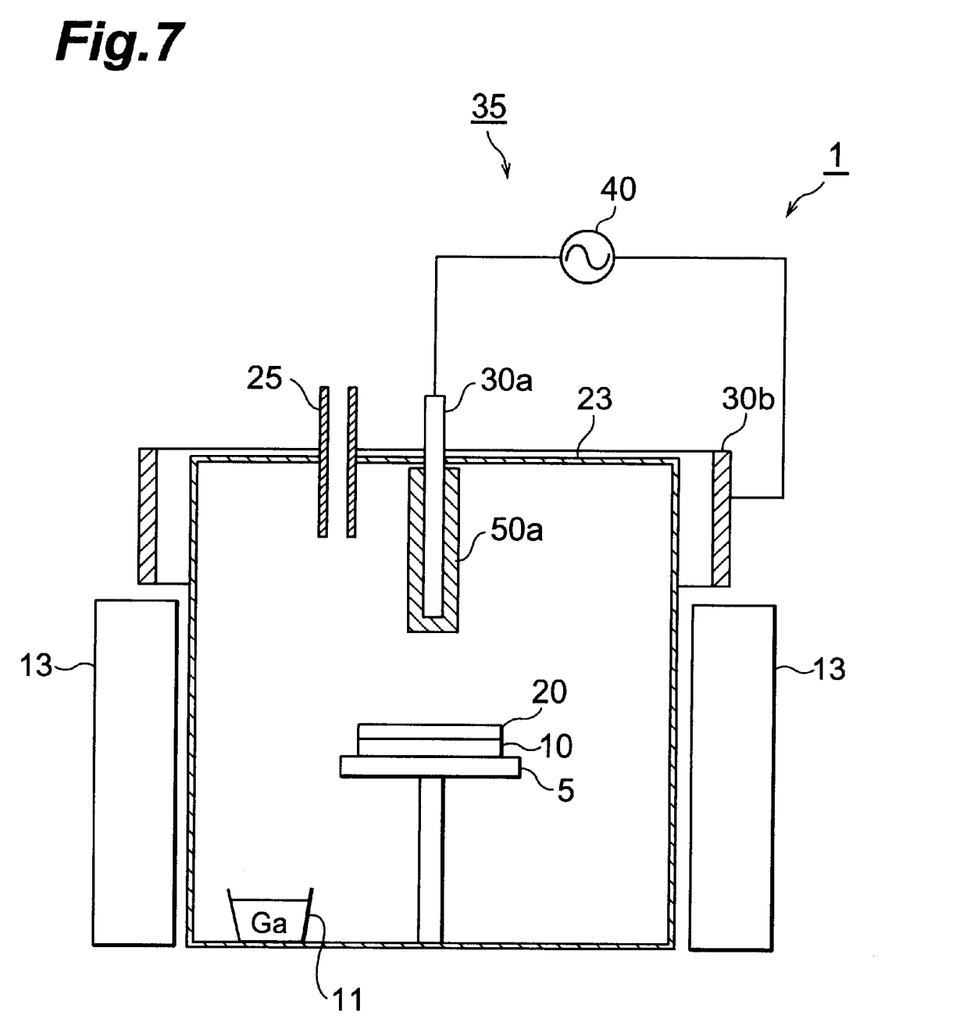
FIG. 7 is a view showing a first modified example of the fifth embodiment.

With reference to FIGS. 7 to 9, modified examples of this embodiment will now be explained. In the first modified example shown in FIG. 7, one rod-like electrode 30a is inserted through the upper face of the reaction tube 23, an annular electrode 30b is disposed around the upper part of the reaction tube 23, and the high-frequency power source 40 is connected to the rod-like electrode 30a and the annular electrode 30b. The rod-like electrode 30a is covered with a dielectric member 50a. As with the fifth embodiment, such a configuration can easily make a plasma out of nitrogen having reached between the rod-like electrode 30a and annular electrode 30b after being introduced from the inlet tube 25. Also, since the dielectric member 50a is disposed between the rod-like electrode 30a and the annular electrode 30b, an electric field can uniformly be generated between the rod-like electrode 30a and the annular electrode 30b. As a consequence, abnormal discharge can be prevented from occurring, so that plasmas can be generated more stably and effectively.

Figure 8:
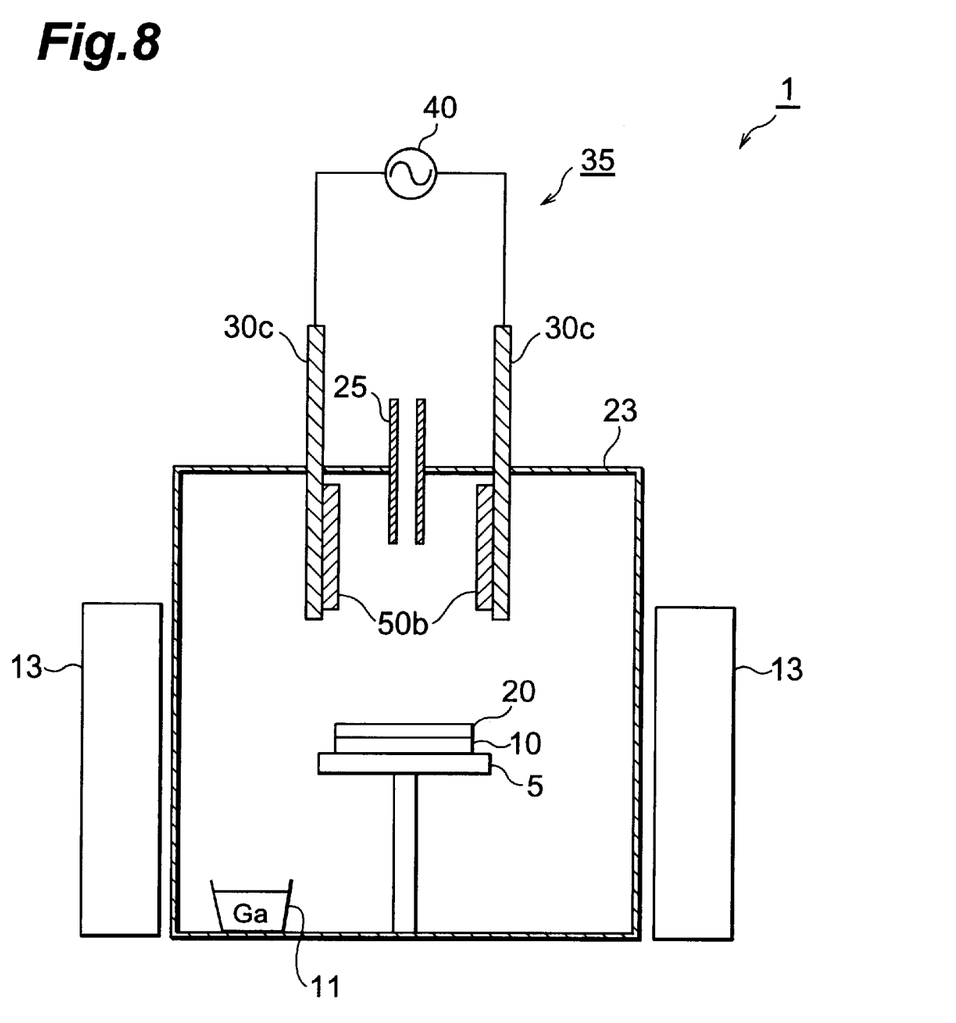
FIG. 8 is a view showing a second modified example of the fifth embodiment.

In the second modified example shown in FIG. 8, two planar electrodes 30c, 30c in parallel are inserted into the reaction tube 23 from the upper face thereof, whereas the high-frequency power source 40 is connected to the planar electrodes 30c, 30c. Also, a planar dielectric member 50b is attached to each of the planar electrodes 30c, 30c on the opposing surface side thereof. As with the fifth embodiment, such a configuration can easily make a plasma out of nitrogen having reached between the planar electrodes 30c, 30c after being introduced from the inlet tube 25. Also, since the planar dielectric member 50b is disposed between the planar electrodes 30c, 30c, an electric field can uniformly be generated between the planar electrodes 30c, 30c. As a consequence, abnormal discharge can be prevented from occurring, so that plasmas can be generated more stably and effectively.

Figure 9:
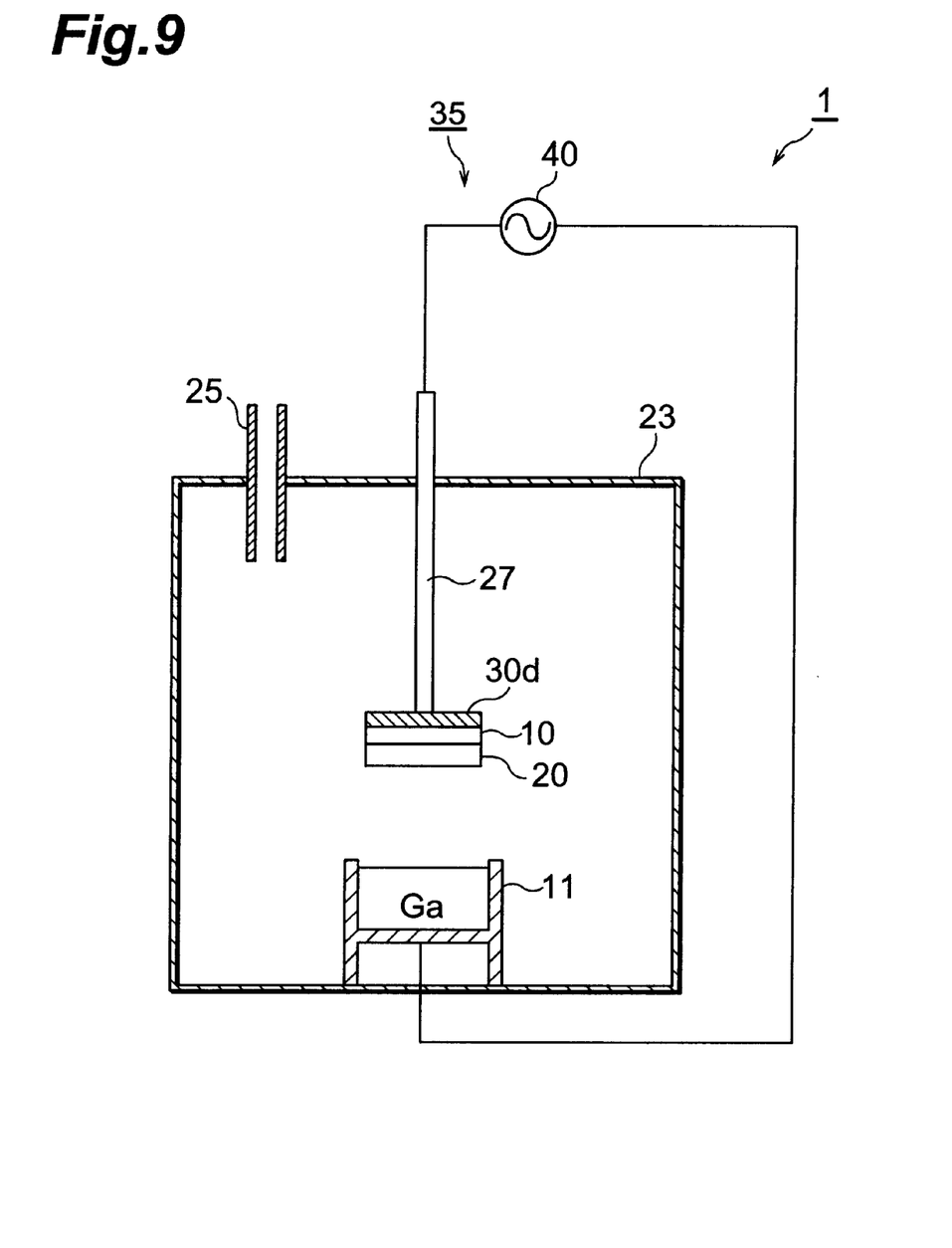
FIG. 9 is a view showing a third modified example of the fifth embodiment.

In the third modified example shown in FIG. 9, a cylindrical support rod 27 is inserted into the reaction tube 23 from the upper face thereof, whereas a disk electrode 30d is attached to the lower end of the support rod 27. The seed crystal 10 is attached to the lower face of the disk electrode 30d. Further, in this modified example, the container 11 is disposed so as to oppose the disk electrode 30d, where as the disk electrode 30d and Ga within the container 11 are electrically connected to the high-frequency power source 40. Namely, Ga within the container 11 is used as an electrode. As with the fifth embodiment, such a configuration can easily make a plasma out of nitrogen having reached between the disk electrode 30d and container 11 after being introduced from the inlet tube 25. In this modified example, the GaN layer 20 would be grown under the seed crystal 10.

Though the fifth embodiment is configured such that high-frequency, high voltages are applied between two electrodes in the first embodiment so as to generate plasmas, it is also applicable to the second to fourth embodiments. If the technique of the fifth embodiment is applied to the third embodiment, then nitrogen can easily be turned into a plasma. If this technique is applied to the second and fourth embodiments, then nitrogen and hydrogen can easily be caused to react with each other upon plasma excitation.

Though the invention achieved by the inventors is specifically explained with reference to the embodiments in the foregoing, the present invention should not be restricted to the above-mentioned embodiments. For example, using aluminum (Al), indium (In), and the like as group III elements, the group III-V nitride semiconductor growth apparatus of the present invention can grow group III-V nitride semiconductors such as AlN, InN, and the like in addition to GaN.

As explained in the foregoing, the group III-V nitride semiconductor growth method and vapor-phase growth apparatus in accordance with the present invention can yield a higher material efficiency and a higher growth rate.

What is claimed is:

1. A group III-V nitride semiconductor growth method for growing a group III-V nitride semiconductor on a seed crystal disposed within a reaction ampoule surrounded by a heater for heating said ampoule, said method comprising the steps of:

heating said reaction ampoule by said heater, said seed crystal being indirectly heated through said reaction ampoule;

plasma-exciting nitrogen continuously introduced into said reaction ampoule and evaporating a group III element disposed within said reaction ampoule; and causing thus plasma-excited nitrogen and evaporated group III element to react with each other, so as to grow the III-V nitride semiconductor on said seed crystal, wherein said step of growing the group III-V nitride semiconductor on said seed crystal includes a step of causing said reaction ampoule to maintain substantially a constant total pressure of about 10 Pa to about 4000 Pa therein.

2. A group III-V nitride semiconductor growth method according to claim 1, wherein positive and negative pulsed voltages are alternately applied between two electrodes, so as to plasma-excite said nitrogen between said electrodes.

3. A group III-V nitride semiconductor growth method for growing a group III-V nitride semiconductor on a seed crystal disposed within a reaction ampoule, said method comprising the steps of:

causing nitrogen continuously introduced into said reaction ampoule to react with hydrogen within said reaction ampoule upon plasma excitation, so as to generate a hydride of nitrogen, and causing said hydride of nitrogen and a group III element evaporated within said reaction ampoule to react with each other, so as to grow the group III-V nitride semiconductor on said seed crystal; and then causing hydrogen generated upon growing said group III-V nitride semiconductor and nitrogen continuously introduced into said reaction ampoule to react with each other upon plasma excitation, so as to generate a hydride of nitrogen.

4. A group III-V nitride semiconductor growth method according to claim 3, wherein positive and negative pulsed voltages are alternately applied between two electrodes, so as to cause said nitrogen and said hydrogen upon plasma excitation between said electrodes.

5. A group III-V nitride semiconductor growth method according to claim 3, wherein said nitrogen is introduced into said reaction ampoule such that said reaction ampoule maintains substantially a constant total pressure therein.

6. A group III-V nitride semiconductor grouwth method for growing a group III-V nitride semiconductor on a seed crystal disposed within a closed reaction ampoule, said method compriing the stepd of:

causing a group III element disposed within said closed reaction ampoule and a halogen molecule of halide to react with each other, so as to generate a halide of said group III element, and causing said halide of group III element and plasma-excited nitrogen to react with each other, so as to grow the group III-V nitride semiconductor on said seed crystal; and then causing the halogen molecule or halide generated when growing said group III-V nitride semiconductor and the group III element disposed within said closed reaction ampoule to react with wach other, so as to generate a halide of said group III element.

7. A group III-V nitride semiconductor growth method according to claim 6, wherein positive and negative pulsed voltages are alternately applied between two electrodes, so as to plasma-excite said nitrogen between said electrodes.

8. A group III-V nitride semiconductor growth method according to claim 6, wherein said nitrogen is introduced into said reaction ampoule such that said reaction ampoule maintains substantially a constant total pressure therein.

9. A group III-V nitride semiconductor growth method for growing a group III-V nitride semiconductor on a seed crystal disposed within a reaction ampoule, said method comprising the steps of:

causing nitrogen introduced into said reaction ampoule and hydrogen within said reaction ampoule to react with each other upon plasma excitation, so as to generate a hydride of nitrogen, and also causing a group III element disposed within said reaction ampoule and a halogen molecule or halide to react with each other, so as to generate a halide of said group III element, and causing said hydride of nitrogen and said halide of group III element to react with each other, so as to grow the group III-V nitride semiconductor on said seed crystal; and then causing said halogen molecule or halide generated upon growing said group III-V nitride semiconductor and the group III element disposed within said reaction ampoule to react with each other, so as to generate a halide of said group III element, and also causing hydrogen which is generated upon growing said group III-V nitride semiconductor and nitrogen to react with each other upon plasma excitation, so as to generate a hydride of nitrogen.

10. A group III-V nitride semiconductor growth method according to claim 9, wherein positive and negative pulsed voltages are alternately applied between two electrodes, so as to cause said nitrogen and said hydrogen to react with each other upon plasma excitation between said electrodes.

11. A group III-V nitride semiconductor growth method according to claim 9, wherein said nitrogen is introduced into said reaction ampoule such that said reaction ampoule maintains substantially a constant total pressure therein.

12. A vapor phase growth apparatus for growing a group III-V nitride semiconductor, said apparatus comprising:

a reaction ampoule having a container disposed therein for containing a group III element and an inlet for introducing nitrogen;

excitation means for plasma-exciting said nitrogen introduced from said inlet;

heating means surrounding said reaction ampoule for heating indirectly a seed crystal disposed within said reaction ampoule and said container; and pressure means for maintaining at substantially a constant total pressure of about 10 Pa to about 4000 Pa therein, wherein, upon growing the group III-V nitride semiconductor on said seed crystal, nitrogen is introduced from said inlet, and no gas is let out from within said reaction ampoule.

13. A vapor phase growth apparatus according to claim 12, wherein said excitation means has two electrodes, and a high-frequency power source for alternately applying positive and negative pulsed voltages between said electrodes.

* * * * *